United States Patent
Lo et al.

(10) Patent No.: US 12,176,288 B2
(45) Date of Patent: Dec. 24, 2024

(54) SEMICONDUCTOR DEVICE INCLUDING FRONTSIDE POWER MESH AND BACKSIDE POWER MESH AND MANUFACTURING METHOD THEREOF

(71) Applicant: Taiwan Semiconductor Manufacturing Company, Ltd., Hsinchu (TW)

(72) Inventors: Wan-Yu Lo, Zhongli (TW); Chin-Shen Lin, Taipei (TW); Chi-Yu Lu, New Taipei (TW); Kuo-Nan Yang, Hsinchu (TW); Chih-Liang Chen, Hsinchu (TW); Chung-Hsing Wang, Baoshan Township, Hsinchu County (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 409 days.

(21) Appl. No.: 17/585,715

(22) Filed: Jan. 27, 2022

(65) Prior Publication Data
US 2023/0260906 A1   Aug. 17, 2023

(51) Int. Cl.
*H01L 23/528* (2006.01)
*H01L 23/50* (2006.01)
*H01L 27/088* (2006.01)
*H01L 27/118* (2006.01)

(52) U.S. Cl.
CPC .......... *H01L 23/5286* (2013.01); *H01L 23/50* (2013.01); *H01L 27/088* (2013.01); *H01L 27/11803* (2013.01)

(58) Field of Classification Search
CPC ..... H01L 23/48; H01L 23/481; H01L 23/482; H01L 23/50; H01L 23/52; H01L 23/522; H01L 23/5226; H01L 23/528; H01L 23/5283; H01L 23/5286; H01L 27/088; H01L 27/11803; H01L 27/11807; H01L 27/1244; H01L 27/1248; H01L 27/1259; H01L 2027/11881
See application file for complete search history.

(56) References Cited

U.S. PATENT DOCUMENTS

| 2023/0187273 A1* | 6/2023 | Murthy | H01L 21/76802 257/751 |
| 2023/0197612 A1* | 6/2023 | Majhi | H01L 23/5286 257/774 |

* cited by examiner

*Primary Examiner* — Cheung Lee
(74) *Attorney, Agent, or Firm* — McClure, Qualey & Rodack, LLP (57) ABSTRACT

Semiconductor devices are provided. A semiconductor device includes a semiconductor substrate, a power switch, a first power mesh and a second power mesh. The power switch is formed over the front surface of the semiconductor substrate. The first power mesh is formed over the power switch and is directly connected to the first terminal of the power switch. The second power mesh is formed over the back surface of the semiconductor substrate and is directly connected to the second terminal of the power switch.

20 Claims, 6 Drawing Sheets

SEMICONDUCTOR DEVICE INCLUDING FRONTSIDE POWER MESH AND BACKSIDE POWER MESH AND MANUFACTURING METHOD THEREOF

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Minimization of power consumption in a semiconductor device, such as an integrated circuit (IC), is a critical issue for semiconductor devices for high speed operations (e.g., mobile terminals). Various technologies to reduce the power consumption have been proposed, but many of them require a larger chip area due to additional circuitry for controlling power. One such technology includes providing a virtual power supply line (VVDD) with a header switch between a main power supply line (TVDD) and the virtual power supply line. The header switch is a power switch that may be switched off when idle. The virtual power supply line may be called a local power line, while the main power supply line may be called a global power line. The power consumption is reduced by turning-off (opening) the header switch coupled to a non-active functional circuit in the semiconductor device.

Figure 1:
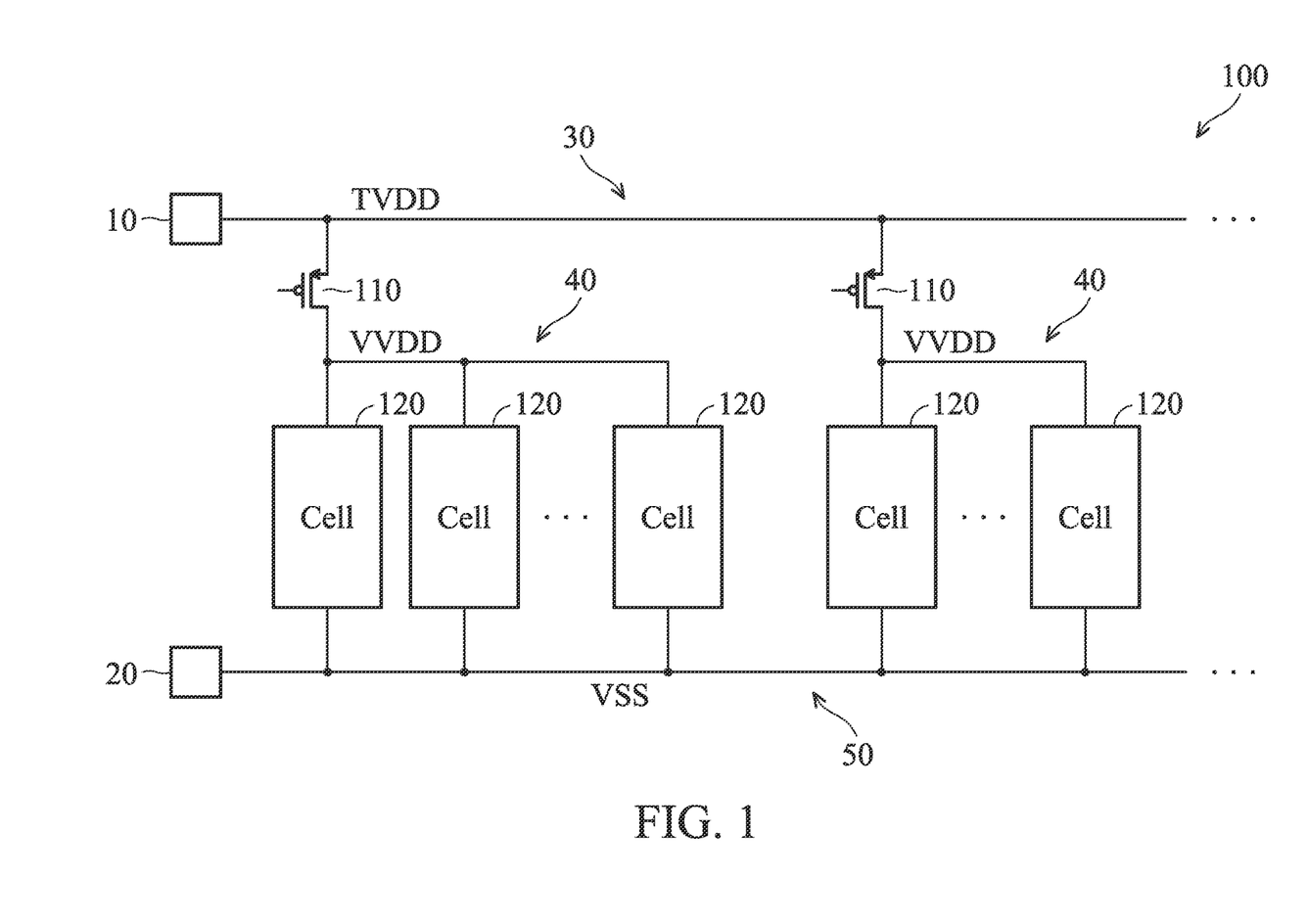
FIG. 1 shows a semiconductor device, in accordance with some embodiments of the disclosure.

FIG. 1 shows a semiconductor device 100, in accordance with some embodiments of the disclosure. The semiconductor device 100 includes multiple functional circuits, and each functional circuit is formed by multiple cells 120. In such embodiment, the cell is a standard cell, such as INV, NAND or NOR logic gate and so on. In some embodiments, the cell may be a memory cell. The cells 120 are arranged in rows and columns of a cell array. In some embodiments, the cells 120 of different functional circuits are arranged in respective cell arrays. In some embodiments, the cells 120 of different functional circuits are arranged in the same cell array.

The global power line TVDD is coupled to a power pad 10, and the power pad 10 is formed in a top metal layer of the semiconductor device 100 and is configured to receive a power signal (e.g., VDD). In some embodiments, the global power line TVDD is coupled to a power generation circuit (e.g., the voltage regulator) which generates a first voltage, such as 0.5V, 0.8V, 1.0V, 1.2V, 1.8V, 2.4V, 3.3V or 5.0V.

The ground line VSS is coupled to a ground pad 20, and the ground pad 20 is formed in the top metal layer of the semiconductor device 100. In some embodiments, the ground line VSS is coupled to a voltage generation circuit (e.g., a voltage regulator) which generates a second voltage lower than the first voltage.

Each power switch 110 is a P-type transistor having a source coupled to the global power line TVDD and a drain coupled to the cells 120. The power switch 110 is controlled to turn on or turn off in response to a control signal (not shown) received by a gate of the P-type transistor. The power switch 110 is used as a header switch to shut off the power supply to respective local power line VVDD which further supplies power to one or more cells 120. In other words, when the power switch 110 is turned off, the cells 120 are be turned off. Moreover, the cells 120 are directly coupled to the ground line VSS. In some embodiments, a footer switch (e.g., the N-type transistor) is arranged between the cells 120 and the ground line VSS.

In FIG. 1, the cells 120 are divided into multiple groups. In each group, the cells 120 share the same local power line VVDD. In other words, the cells 120 in the same group are coupled to the same power switch 110. Once the power switch 110 is turned on, the power signal is applied to the cells 120 from the power pad 10 and through the local power line VVDD, so as to power the cells 120. Thus, the cells 120 are capable to perform the corresponding operations or functions.

In some embodiments, the cells 120 of the same group and the corresponding power switch 110 are disposed in the same row of the cell array. In some embodiments, the cells 120 of the same group and the corresponding power switch 110 are disposed in the adjacent rows of the cell array.

In some embodiments, the cells 120 of different groups are arranged in respective cell arrays. In some embodiments, the power switches 110 are disposed at the periphery of the cell arrays. In some embodiments, the power switches 110 are disposed inside the cell arrays.

In some embodiments, the cells 120 of different groups are arranged in the same cell array, and the local power lines VVDD of the groups are coupled together. In some embodiments, the power switches 110 are disposed at the periphery of the cell array. In some embodiments, the power switches 110 are disposed inside the cell array.

In the semiconductor device 100, the global power line TVDD is coupled to each power switch 110 through a power mesh (or power grid) 30. The power mesh 30 is an interconnection structure formed by multiple conductive lines (e.g., the metal lines in various metal layers) and multiple connecting features (e.g., the vias in various via layers). Similarly, each local power line VVDD is coupled to the corresponding cells 120 through a power mesh (or power grid) 40. The power mesh 40 is an interconnection structure formed by multiple conductive lines (e.g., the metal lines in various metal layers) and multiple connecting features (e.g., the vias in various via layers).

Furthermore, the cells 120 are coupled to the ground line VSS through a ground mesh (or ground grid) 50. The ground mesh 50 is an interconnection structure formed by multiple conductive lines (e.g., the metal lines in various metal layers) and multiple connecting features (e.g., the vias in various via layers).

Figure 2:
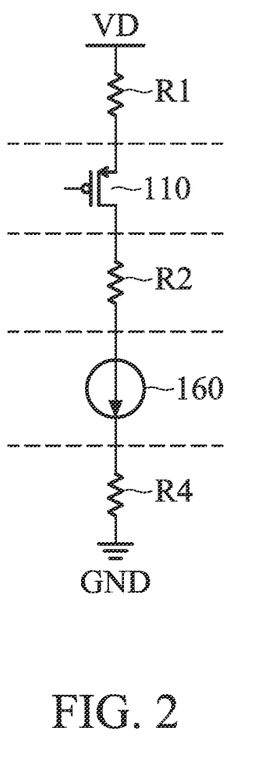
FIG. 2 shows an equivalent circuit of a group of cells and the related power lines of FIG. 1, in accordance with some embodiments of the disclosure.

FIG. 2 shows an equivalent circuit of a group of cells 120 and the related power lines of FIG. 1, in accordance with some embodiments of the disclosure. The resistor R1 is coupled between the voltage source terminal VD and the first terminal of the power switch 110. The voltage source terminal VD represents the power pad 10. The resistor R1 is an equivalent resistor that represents the resistance of the power mesh 30, and the power mesh 30 is the interconnection structure of the global power line TVDD. The power switch 110 is coupled between the resistor R1 and the resistor R2. The resistor R2 is an equivalent resistor that represents the resistance of the power mesh 40, and the power mesh 40 is the interconnection structure of the local power line VVDD.

The resistor R2 is coupled between the second terminal of the power switch 110 and the current source 160. The current source 160 is an equivalent current source that represents the currents flowing through the cells 120 of the group. The current source 160 is coupled between the resistor R2 and the resistor R4. The resistor R4 is an equivalent resistor that represents the resistance of the ground mesh 50, and the ground mesh 50 is the interconnection structure of the ground line VSS. Moreover, the resistor R4 is coupled between the current source 160 and the ground terminal GND. The ground terminal GND represents the ground pad 20.

Figure 3:
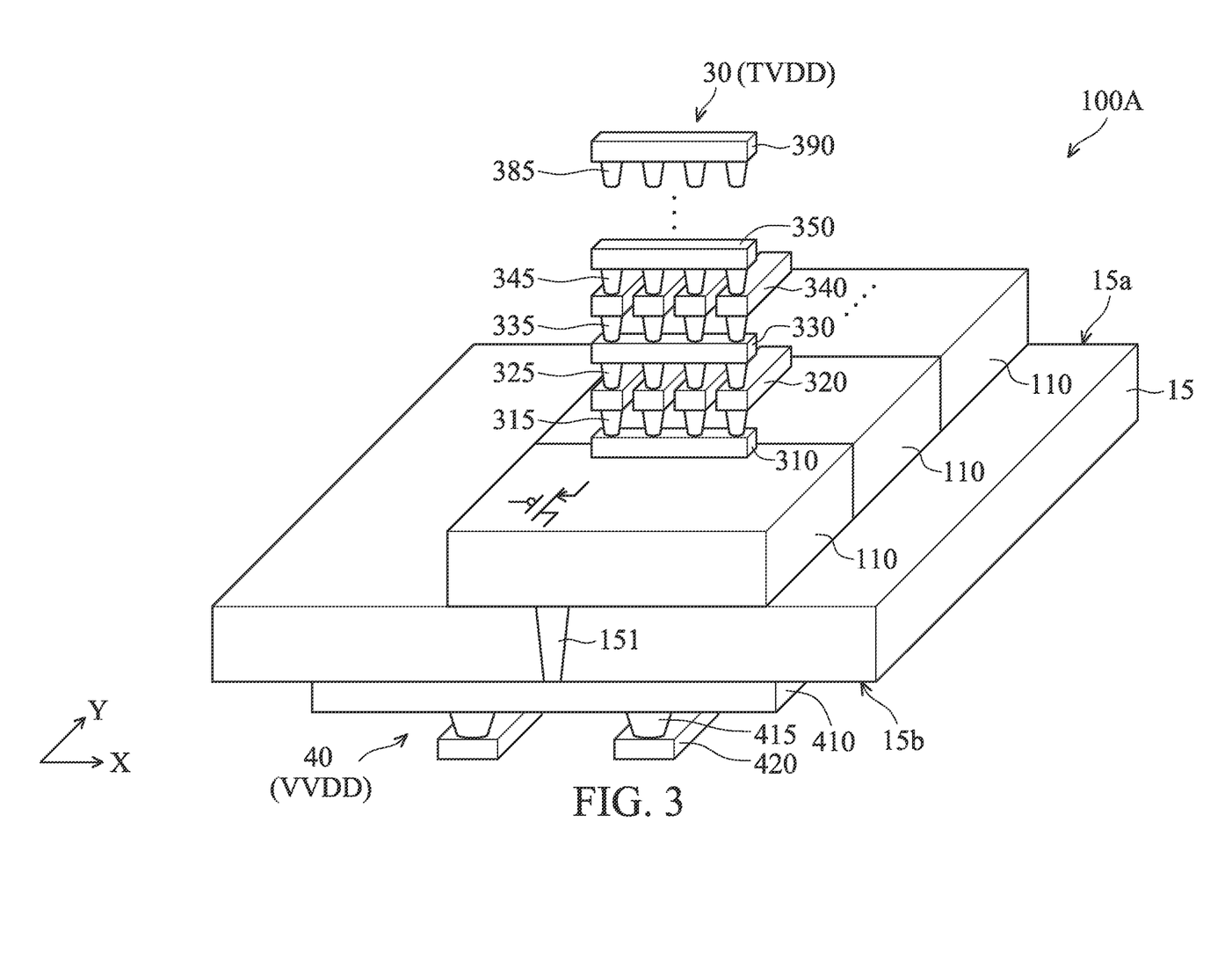
FIG. 3 shows a schematic illustrating the power switch of a semiconductor device, in accordance with some embodiments of the disclosure.

FIG. 3 shows a schematic illustrating the power switch 110 of a semiconductor device 100A, in accordance with some embodiments of the disclosure. The power switch 110 is formed over a front surface 15a of semiconductor substrate 15. In some embodiments, the semiconductor substrate 15 is a Si substrate. In some embodiments, the material of the semiconductor substrate 15 is selected from a group consisting of bulk-Si, SiP, SiGe, SiC, SiPC, Ge, SOI—Si, SOI—SiGe, III-VI material, or a combination thereof. The power switch 110 includes a P-type transistor. The P-type transistor is selected from a group consisting of FINFET structure, vertical gate all around (GAA), horizontal GAA, nano wire, nano sheet, or a combination thereof.

In FIG. 3, the power mesh 30 is formed over the power switch 110, and the power mesh 30 is directly connected to the first terminal of the power switch 110 (e.g., the source of the P-type transistor). As described above, the power mesh 30 is the interconnection structure of the global power line TVDD. In some embodiments, the power mesh 30 includes the metal lines 310 through 390 and the vias 315 through 385.

In some embodiments, the power lines (or rails) and the ground lines (rails) repeat at regular intervals across the region of the cells 120. Each of the power lines run both vertically and horizontally at regular interval then this is called power mesh (or power grid). Furthermore, each of the ground lines run both vertically and horizontally at regular interval then this is called ground mesh (or ground grid).

The metal lines 310 through 390 are formed in different metal layers. For example, the metal line 310 extending in X-direction is formed in the lowest metal layer (e.g., M0) over the front surface 15a of the semiconductor substrate 15. The metal lines 320 extending in Y-direction are formed in a first metal layer (e.g., M1), and the first metal layer is formed over the lowest metal layer. The metal line 330 extending in X-direction is formed in a second metal layer (e.g., M2), and the second metal layer is formed over the first metal layer. The metal lines 340 extending in Y-direction are formed in a third metal layer (e.g., M3), and the third metal layer is formed over the second metal layer. The metal line 350 extending in X-direction is formed in a fourth metal layer (e.g., M4), and the fourth metal layer is formed over the third metal layer, and so on. Finally, the metal line 390 extending in X-direction is formed in the highest metal layer or the top metal layer (e.g., Mx). In some embodiments, the power mesh 30 is coupled to the power pad 10 through the metal line 390.

Similarly, the vias 315 through 385 are formed in different via layers. For example, the vias 315 are formed in the lowest via layer (e.g., VIA0), and the lowest via layer is formed between the lowest metal layer and the first metal layer. The vias 325 are formed in a first via layer (e.g., VIA1), and the first via layer is formed between the first and second metal layers. The vias 335 are formed in a second via layer (e.g., VIA2), and the second via layer is formed between the second and third metal layers, and so on.

In FIG. 3, the power mesh 40 is formed under the semiconductor substrate 15. In other words, the power mesh 40 is formed over a back surface 15b of the semiconductor substrate 15. Furthermore, the power mesh 40 is directly connected to the second terminal of the power switch 110 (e.g., the drain of the P-type transistor) through a connecting feature 151 (e.g., contact or via) formed in the semiconductor substrate 15. As described above, the power mesh 40 is the interconnection structure of the local power line VVDD. In some embodiments, the power mesh 40 includes the metal lines (or power rails) 410 and 420 and the vias 415.

The metal lines 410 and 420 are formed in different metal layers over the back surface 15b of the semiconductor substrate 15. For example, the metal line 410 extending in X-direction is formed in the metal layer (e.g., BM0) that is closest to the semiconductor substrate 15. In some embodiments, the metal line 410 is also called as a super power rail (SPR). The metal lines 420 extending in Y-direction are formed in a metal layer (e.g., BM1) under the metal layer corresponding to the metal line 410. Furthermore, the vias 415 are formed in the via layer (e.g., BVIA0) closest to the semiconductor substrate 15. In such embodiments, the metal line 410 and the metal line 310 are disposed on opposite sides of the power switch 110, i.e., the projections of the metal lines 410 and 310 on the semiconductor substrate 15 are separated from each other.

In the semiconductor device 100A, the metal lines of the power mesh 40 are thicker than the metal lines of the power mesh 30. In other words, the metal lines 410 and 420 under the semiconductor substrate 15 are thicker than the metal lines 310 through 390 over the semiconductor substrate 15. In some embodiments, the vias 415 of the power mesh 40 are thicker than the vias 315 through 385 of the power mesh 30. Compared with the traditional semiconductor device including the power mesh of the local power line VVDD formed over the front surface of the semiconductor substrate, the power mesh 40 of the local power line VVDD formed over the back surface 150b of the semiconductor substrate has less resistance, i.e., the resistor R2 of FIG. 2 is decreased. Therefore, the IR drop of the local power line VVDD is reduced in the semiconductor device 100A.

Figure 4:
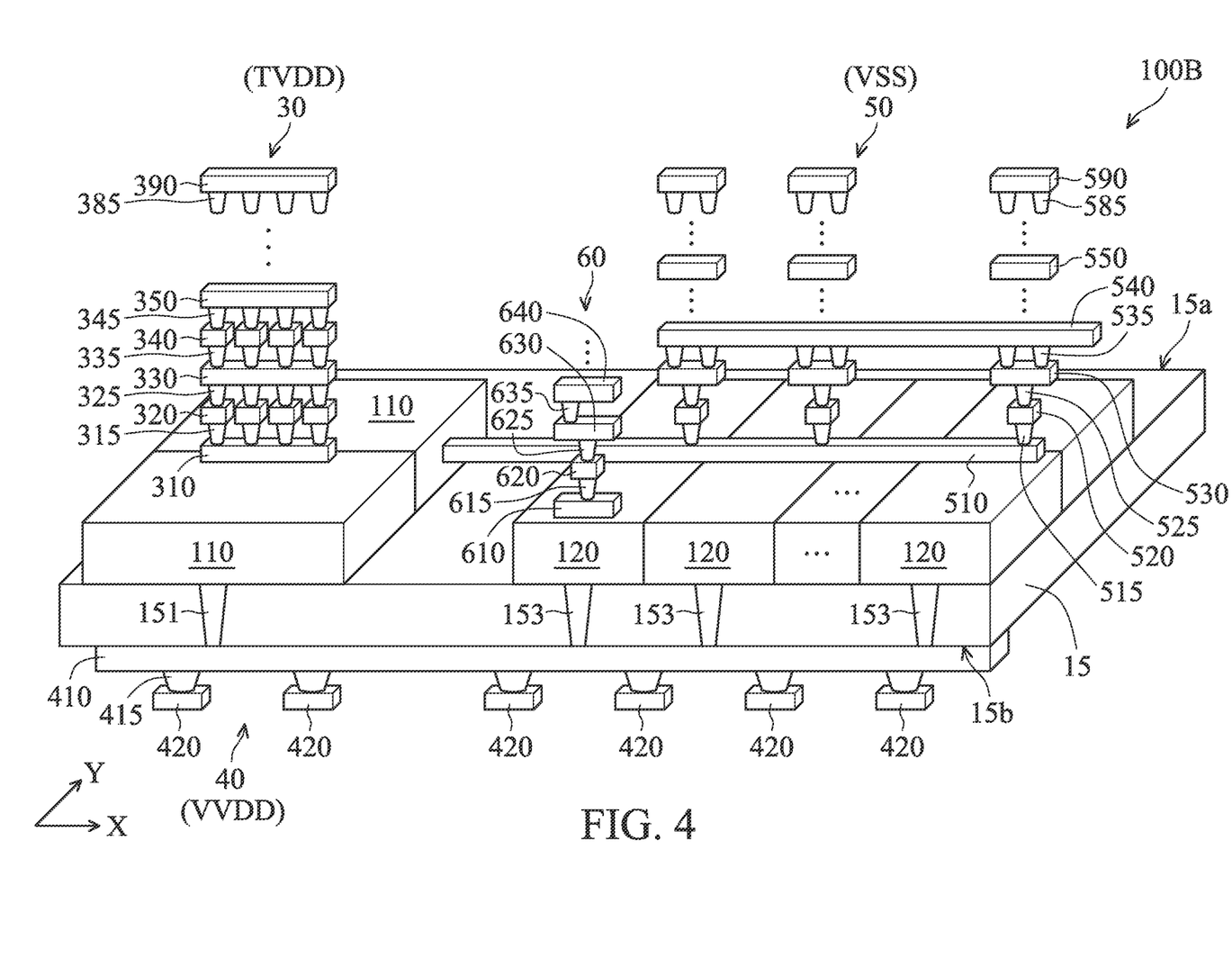
FIG. 4 shows a schematic illustrating a semiconductor device, in accordance with some embodiments of the disclosure.

FIG. 4 shows a schematic illustrating a semiconductor device 100B, in accordance with some embodiments of the disclosure. The power switch 110 and the cells 120 are formed over the front surface 15a of semiconductor substrate 15. In such embodiments, the power switch 110 and the cells 120 are arranged in the same row of a cell array. As described above, the power switch 110 includes a P-type transistor, and the cells 120 are the standard cells formed by P-type and N-type transistors. Moreover, the P-type transistor of the power switch 110 is larger than the P-type transistor of the cell 120. In the semiconductor device 100B, the connection configuration of the power switch 110 is similar to that described in FIG. 2.

In FIG. 4, the power mesh 40 is formed over the back surface 15b of the semiconductor substrate 15. In addition to being electrically connected to the second terminal of the power switch 110 (e.g., the drain of the P-type transistor) through a connecting feature 151 (e.g., contact), the power mesh 40 is further electrically connected to the cells 120 through the connecting features 153 (e.g., contact). In some embodiments, the cell 120 is the standard cell, and the power mesh 40 is electrically connected to the source of the P-type transistors of the cells 120 through the connecting features 153. Thus, the power signal from the power switch 110 is supplied to the cells 120 through the power mesh 40. In other words, no power mesh is coupled between the power switch 110 and the cells 20 over the front surface 15a of the semiconductor substrate 15. As described above, the power mesh 40 includes the metal lines 410 and 420 and the vias 415.

In FIG. 4, the ground mesh 50 is formed over the cells 120. As described above, the ground mesh 50 is the interconnection structure of the ground line VSS. In some embodiments, the ground mesh 50 includes the metal lines (or ground rail) 510 through 590 and the vias 515 through 585.

The metal lines 510 through 590 are formed in different metal layers. For example, the metal line 510 extending in X-direction is formed in the lowest metal layer (e.g., M0) over the front surface 15a of the semiconductor substrate 15. The metal line 510 of the ground mesh 50 and the metal line 310 of the power mesh 30 are formed in the same metal layer, and the metal line 510 is electrically separated from the metal line 310. The metal lines 520 extending in Y-direction are formed in the first metal layer (e.g., M1). The metal lines 520 of the ground mesh 50 and the metal line 320 of the power mesh 30 are formed in the same metal layer, and the metal line 520 is electrically separated from the metal line 320.

The metal line 530 extending in X-direction is formed in the second metal layer (e.g., M2). The metal lines 530 of the ground mesh 50 and the metal line 330 of the power mesh 30 are formed in the same metal layer, and the metal line 530 is electrically separated from the metal line 330. The metal lines 540 extending in Y-direction are formed in the third metal layer (e.g., M3). The metal lines 540 of the ground mesh 50 and the metal line 340 of the power mesh 30 are formed in the same metal layer, and the metal line 540 is electrically separated from the metal line 340. The metal line 550 extending in X-direction is formed in the fourth metal layer (e.g., M4). The metal lines 550 of the ground mesh 50 and the metal line 350 of the power mesh 30 are formed in the same metal layer, and the metal line 550 is electrically separated from the metal line 350. The metal line 590 extending in X-direction is formed in the highest metal layer or the top metal layer (e.g., Mx). In some embodiments, the ground mesh 50 is coupled to the ground pad 20 through the metal line 590. The metal line 590 of the ground mesh 50 and the metal line 390 of the power mesh 30 are formed in the same metal layer, and the metal line 590 is electrically separated from the metal line 390.

Similarly, the vias 515 through 585 are formed in different via layers. For example, the vias 515 are formed in the lowest via layer (e.g., VIA0), and the vias 515 and the vias 315 are formed in the same via layer. The vias 525 are formed in the first via layer (e.g., VIA1), and the vias 525 and the vias 325 are formed in the same via layer. The vias 535 are formed in the second via layer (e.g., VIA2), and the vias 535 and the vias 335 are formed in the same via layer, and so on.

In each cell 120, the input signals, output signals and internal signals are transferred by respective signal paths 60. The signal paths 60 are formed over the cells 120. Each signal path 60 is an interconnection structure that is formed by multiple conductive lines (e.g., the metal lines in various metal layers) and multiple connecting features (e.g., the vias in various via layers). In order to simplify the description, only one signal path 60 is shown in FIG. 4.

In FIG. 4, the signal path 60 is the interconnection structure for providing an input signal to the cell 120 or transmitting an output signal of the cell 120 to subsequent cell 120 (or other circuit). In some embodiments, the signal path 60 includes the metal lines 610 through 640 and the vias 615 through 635.

The metal lines 610 through 640 are formed in different metal layers. For example, the metal line 610 extending in X-direction is formed in the lowest metal layer (e.g., M0) over the front surface 15a of the semiconductor substrate 15. The metal line 610 of the signal path 60, the metal line 310 of the power mesh 30 and the metal line 510 of the ground mesh 50 are formed in the same metal layer, and the metal line 610 is electrically separated from the metal lines 310 and 510. The metal line 620 extending in Y-direction are formed in the first metal layer (e.g., M1). The metal line 620 of the signal path 60, the metal line 320 of the power mesh 30 and the metal line 520 of the ground mesh 50 are formed in the same metal layer, and the metal line 620 is electrically separated from the metal lines 320 and 520.

The metal line 630 extending in X-direction is formed in the second metal layer (e.g., M2). The metal line 630 of the signal path 60, the metal line 330 of the power mesh 30 and the metal line 530 of the ground mesh 50 are formed in the same metal layer, and the metal line 630 is electrically separated from the metal lines 330 and 530. The metal line 640 extending in Y-direction is formed in the third metal layer (e.g., M3). The metal line 640 of the signal path 60, the metal line 340 of the power mesh 30 and the metal line 540 of the ground mesh 50 are formed in the same metal layer, and the metal line 640 is electrically separated from the metal lines 340 and 540.

In such embodiments, the metal lines of the power mesh 40 are thicker than the metal lines of the power mesh 30, the ground mesh 50 and the signal paths 60. In other words, the metal lines 410 and 420 under the semiconductor substrate 15 are thicker than the metal lines 310 through 390, the metal lines 510 through 590 and the metal lines 610 through 640 over the semiconductor substrate 15. In some embodiments, the vias of the power mesh 40 are thicker than the vias of the power mesh 30, the ground mesh 50 and the signal paths 60. Compared with the traditional semiconductor device that has the power mesh of the local power line VVDD formed over the front surface of the semiconductor substrate, the power mesh 40 of the local power line VVDD formed over the back surface 15b of the semiconductor substrate 15 has less resistance, i.e., the resistor R2 of FIG. 2 is decreased. Therefore, the IR drop of the local power line VVDD is reduced in the semiconductor device 100.

In some embodiments, no power mesh of the local power line VVDD is formed over the cells 120, i.e., the power mesh of the local power line VVDD is formed under the cells 120, thereby providing more routing area over the cells 120 for the signals of the semiconductor device 100B.

Figure 5:
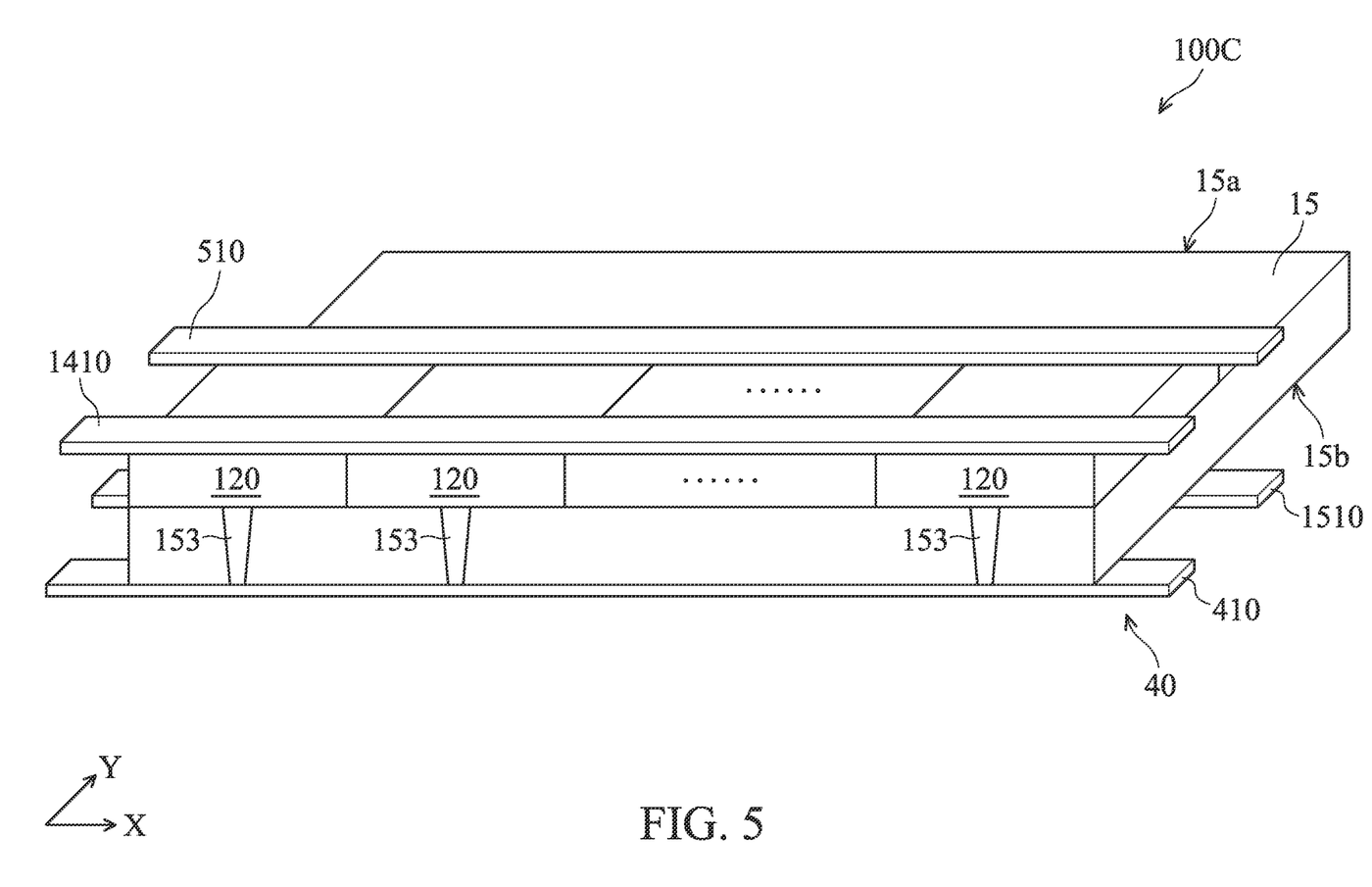
FIG. 5 shows a schematic illustrating a semiconductor device, in accordance with some embodiments of the disclosure.

FIG. 5 shows a schematic illustrating a semiconductor device 100C, in accordance with some embodiments of the disclosure. The connection configuration of the semiconductor device 100C in FIG. 5 is similar with the connection configuration of the semiconductor device 100B in FIG. 4. In order to simplify the description, only the difference between the semiconductor device 100C in FIG. 5 and the semiconductor device 100B in FIG. 4 is shown in FIG. 5.

In FIG. 5, the semiconductor device 100C further includes the metal line 1410 over the cells 120 and the metal line 1510 under the cells 120 extending in X-direction. In some embodiments, the metal line 1410 overlaps the metal line 410 of the power mesh 40, and the metal line 1510 overlaps the metal line 510 of the ground mesh 50.

In FIG. 5, the metal line 1410 is a power rail, and the metal line 1410 is electrically connected to the metal line 410 through the cells 120. For example, the metal line 1410 and the metal line 410 are both coupled to the source of the P-type transistors of the cells 120. In other words, the power signal is delivered between the standard cells through the metal line 1410 and the metal line 410.

In the semiconductor device 100C, metal line 410 is thicker than metal line 1410. Furthermore, the metal line 1410 extending in the X-direction is formed in the lowest metal layer (e.g., M0) over the front surface 15a of the semiconductor substrate 15. The metal line 1410, the metal line 310 of the power mesh 30 and the metal line 510 of the ground mesh 50 are formed in the same metal layer, and the metal line 1410 is electrically separated from the metal lines 310 and 510. In such embodiment, the metal line 1410 and the metal line 510 are disposed on opposite sides of the cells 120 over the front surface 15a of the semiconductor substrate 15.

By using the metal line 1410, the IR drop of the local power line VVDD is reduced in the semiconductor device 100C since the metal line 1410 and the metal line 410 of the power mesh 40 share the current of the power signal. In other words, the metal line 1410 and the metal line 410 are coupled in parallel, thus the rail resistance of the local power line VVDD is decreased. Furthermore, if the metal line 1410 or 410 has defect or fail from electromigration (EM), the other metal line is capable of providing voltage and current of the power signal to the cells 120, thereby enhancing cell reliability for the cells 120. For example, if a section (or segment) of the metal line 410 is defective, the power signal can be provided to the cells 120 through the metal line 1410.

In FIG. 5, the metal line 1510 is a ground rail, and the metal line 1510 is electrically connected to the metal line 510 through the cells 120. For example, the metal line 1510 and the metal line 510 are both coupled to the source of the N-type transistors of the cells 120. In such embodiment, the metal line 410 and the metal line 1510 are disposed on opposite sides of the cells 120 over the back surface 15b of the semiconductor substrate 15.

In the semiconductor device 100C, metal line 1510 is thicker than metal line 510. Furthermore, the metal line 1510 extending in the X-direction is formed in the metal layer (e.g., BM0) under and closest to the semiconductor substrate 15. Metal line 1510 and metal line 410 of the power mesh 40 are formed in the same metal layer, and metal line 1510 is electrically separated from metal line 410.

The metal line 1510 and the metal line 510 are coupled in parallel, thus the rail resistance of the ground line VSS is decreased. Furthermore, if the metal line 1510 or 510 has defect, the other metal line is capable of providing connection configuration of ground to the cells 120, thereby enhancing cell reliability for the cells 120.

Figure 6:
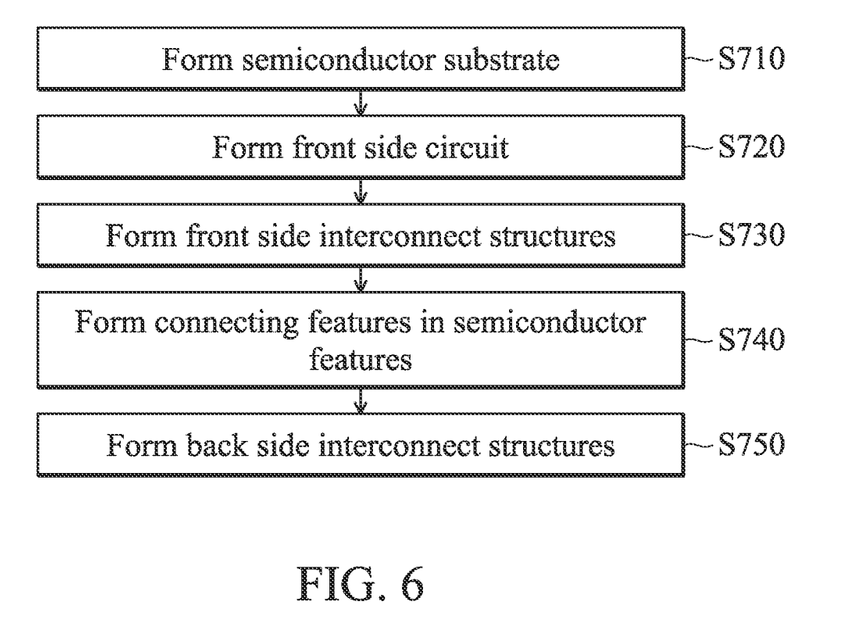
FIG. 6 shows a method for manufacturing a semiconductor device with a backside power mesh, in accordance with some embodiments of the disclosure.

FIG. 6 shows a method for manufacturing a semiconductor device with a backside power mesh, in accordance with some embodiments of the disclosure. It is understood that additional operations can be provided before, during, and after the process flow shown by FIG. 6. Furthermore, some of the operations described below can be replaced or eliminated, for additional embodiments of the method. The order of the operations/processes may be interchangeable. Materials, configurations, dimensions, processes and/or operations as explained with respect to the foregoing embodiments may be employed in the following embodiments, and the detailed description thereon may be omitted.

In operation S710, a semiconductor substrate 15 is formed. In operation S720, a front side circuit is formed (or manufactured) on a front surface 15a of the semiconductor substrate 15. The front side circuit includes the power switches 110 and the cells 120. In operation S730, the front side interconnect structures are formed over the front side circuit. As described above, the front side interconnect structures include the power mesh 30 of the global power line TVDD, the ground mesh 50 of the ground line VSS, and the signal paths 60. In some embodiments, the front side interconnect structures further include the additional power rail 1410 for the local power line VVDD.

In operation S740, the connecting features 151 coupled to the power switch and the connecting features 153 coupled to the cells 120 are formed in the semiconductor substrate 15. In operation S750, the back side interconnect structures are formed over the back surface 15b of the semiconductor substrate 15. As described above, the back side interconnect structures include the power mesh 40 of the local power line VVDD. In some embodiments, the back side interconnect structures further include the additional ground rail 1510 for the ground line VSS. In some embodiments, the thickness of the metal lines and vias in the back side interconnect structures are thicker than the thickness of the metal lines and vias in the front side interconnect structures.

It will be understood that not all advantages have been necessarily discussed herein, no particular advantage is required for all embodiments or examples, and other embodiments or examples may offer different advantages.

Embodiments of the semiconductor devices with a backside power mesh and methods for manufacturing the semiconductor devices are provided. By formed the power mesh 40 of the local power line VVDD under the power switches 110 and the cells 120, the interconnection structure of the local power line VVDD has less resistance, thereby decreasing IR drop of the local power line VVDD. Moreover, compared with the traditional semiconductor device, the power mesh 40 of the local power line VVDD does not occupy the metal resources for signal routing over the cells 120, thereby providing more routing area over the cells 120 for the signals of the semiconductor device.

In some embodiments, a semiconductor device is provided. The semiconductor device includes a semiconductor substrate, a power switch, a first power mesh and a second power mesh. The power switch is formed over the front surface of the semiconductor substrate. The first power mesh is formed over the power switch and is directly connected to the first terminal of the power switch. The second power mesh is formed over the back surface of the semiconductor substrate and is directly connected to the second terminal of the power switch.

In some embodiments, a semiconductor device is provided. The semiconductor device includes a semiconductor substrate, a front side circuit, a first power mesh and a second power mesh. The front side circuit is formed over the semiconductor substrate, and includes at least one power switch and a plurality of cells. The first power mesh is formed over the power switch. The second power mesh is formed under the semiconductor substrate and electrically connected to the front side circuit. The cells are powered by a power signal from the first power mesh through the power switch and the second power mesh in sequence.

In some embodiments, a method for manufacturing a semiconductor device is provided. A semiconductor substrate is formed. A front side circuit is formed over the semiconductor substrate. The front side circuit includes at least one power switch and a plurality of cells. A first power mesh is formed over the power switch. A second power mesh is formed under the semiconductor substrate. The second power mesh is electrically connected to the front side circuit. The cells are powered by a power signal from the first power mesh through the power switch and the second power mesh in sequence. The power lines of the second power mesh are thicker than the power lines of the first power mesh.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate;
   a power switch formed over a front surface of the semiconductor substrate;
   a first power mesh formed over the power switch and directly connected to a first terminal of the power switch; and
   a second power mesh formed over a back surface of the semiconductor substrate and directly connected to a second terminal of the power switch;
   wherein the first power mesh comprises a first power rail over the power switch and extending in a first direction, and the second power mesh comprises a second power rail under the power switch and extending in the first direction, wherein projections of the first and second power rails on the semiconductor substrate are separated from each other.

2. The semiconductor device as claimed in claim 1, wherein the second power rail is thicker than the first power rail.

3. The semiconductor device as claimed in claim 1, further comprising:
   a plurality of standard cells formed over the front surface of the semiconductor substrate and electrically connected to the second power mesh,
   wherein when the power switch is turned on, a power signal is provided to the standard cells through the first power mesh, the power switch and the second power mesh in sequence.

4. The semiconductor device as claimed in claim 3, further comprising:
   a third power rail formed over the front surface of the semiconductor substrate, and electrically connected to the standard cells,
   wherein the power signal is delivered between the standard cells through the third power rail.

5. The semiconductor device as claimed in claim 3, further comprising:
   a ground mesh formed over the front surface of the semiconductor substrate, and electrically connected to the standard cells.

6. The semiconductor device as claimed in claim 4, wherein the power switch comprises a first PMOS transistor, and the first PMOS transistor is larger than a second PMOS transistor of each of the standard cells.

7. The semiconductor device as claimed in claim 1, further comprising:

a power pad formed over the front surface of the semiconductor substrate and electrically connected to the first power mesh, wherein when the power switch is turned on, a power signal from the power pad is provided to the second power mesh through the first power mesh and the power switch.

8. A semiconductor device, comprising:
a semiconductor substrate;
a front side circuit formed over the semiconductor substrate, and comprising:
at least one power switch; and
a plurality of cells;
a first power mesh formed over the power switch; and
a second power mesh formed under the semiconductor substrate and electrically connected to the front side circuit,
wherein the cells are powered by a power signal from the first power mesh through the power switch and the second power mesh in sequence.

9. The semiconductor device as claimed in claim 8, wherein the first power mesh comprises a first power rail over the power switch and extending in a first direction, and the second power mesh comprises a second power rail under the power switch and the cells and extending in the first direction, wherein projections of the first and second power rails on the semiconductor substrate are separated from each other.

10. The semiconductor device as claimed in claim 9, wherein the second power rail is thicker than the first power rail.

11. The semiconductor device as claimed in claim 8, wherein the power switch and the cells are arranged in the same row of an array.

12. The semiconductor device as claimed in claim 8, further comprising:
a third power rail formed over the cells, and electrically connected to the cells,
wherein the power signal is delivered between the cells further through the third power rail.

13. The semiconductor device as claimed in claim 8, further comprising:
a ground mesh formed over the cells, and electrically connected to the cells.

14. The semiconductor device as claimed in claim 8, wherein the power switch comprises a first PMOS transistor, and the first PMOS transistor is larger than a second PMOS transistor of each of the cells.

15. A method for manufacturing a semiconductor device, comprising:
forming a semiconductor substrate;
forming a front side circuit over the semiconductor substrate, wherein the front side circuit comprises:
at least one power switch; and
a plurality of cells;
forming a first power mesh over the power switch; and
forming a second power mesh under the semiconductor substrate, wherein the second power mesh is electrically connected to the front side circuit,
wherein the cells are powered by a power signal from the first power mesh through the power switch and the second power mesh in sequence,
wherein power lines of the second power mesh are thicker than power lines of the first power mesh.

16. The method as claimed in claim 15, wherein the first power mesh comprises a first power line over the power switch and extending in a first direction, and the second power mesh comprises a second power line under the power switch and the cells and extending in the first direction, wherein projections of the first and second power lines on the semiconductor substrate are separated from each other.

17. The method as claimed in claim 15, wherein the power switch and the cells are arranged in the same row of an array.

18. The method as claimed in claim 15, further comprising:
forming a third power line over the cells,
wherein the third power line is electrically connected to the cells,
wherein the power signal is delivered between the cells further through the third power line.

19. The method as claimed in claim 15, further comprising:
forming a ground mesh over the cells,
wherein the ground mesh is electrically connected to the cells.

20. The method as claimed in claim 15, wherein the power switch comprises a first PMOS transistor, and the first PMOS transistor is larger than a second PMOS transistor of each of the cells.

* * * * *